(12) United States Patent
Selvamanickam et al.

(10) Patent No.: US 8,153,281 B2
(45) Date of Patent: Apr. 10, 2012

(54) METALORGANIC CHEMICAL VAPOR DEPOSITION (MOCVD) PROCESS AND APPARATUS TO PRODUCE MULTI-LAYER HIGH-TEMPERATURE SUPERCONDUCTING (HTS) COATED TAPE

(75) Inventors: Venkat Selvamanickam, Wynantskill, NY (US); Hee-Gyoun Lee, Guilderland, NY (US)

(73) Assignee: SuperPower, Inc., Schenectady, NY (US)

(*) Notice: Subject to any disclaimer, the term of this patent is extended or adjusted under 35 U.S.C. 154(b) by 617 days.

(21) Appl. No.: 10/602,468

(22) Filed: Jun. 23, 2003

(65) Prior Publication Data

US 2004/0255855 A1    Dec. 23, 2004

(51) Int. Cl.
- *H01B 12/06* (2006.01)
- *H01L 39/12* (2006.01)
- *B32B 18/00* (2006.01)
- *C23C 14/08* (2006.01)

(52) U.S. Cl. ......... 428/701; 428/469; 428/472; 428/702

(58) Field of Classification Search .......... 428/697, 428/701, 702, 336, 930; 174/125.1; 438/2; 505/234, 230, 473; 118/715, 719, 300; 427/255.28, 427/255.32, 255.395, 255.7, 571, 575, 584, 427/586, 62, 118, 576, 585, 126.3
See application file for complete search history.

(56) References Cited

U.S. PATENT DOCUMENTS

| | | | |
|---|---|---|---|
| 5,106,828 A * | 4/1992 | Bhargava et al. | 505/440 |
| 5,739,086 A * | 4/1998 | Goyal et al. | 505/473 |
| 5,772,764 A | 6/1998 | Akimoto | |
| 5,872,080 A | 2/1999 | Arendt et al. | |
| 6,022,832 A | 2/2000 | Fritzemeier et al. | |
| 6,383,989 B2 * | 5/2002 | Jia et al. | 505/236 |
| 6,596,085 B1 | 7/2003 | Schmitt et al. | |
| 6,610,632 B2 * | 8/2003 | Honjo et al. | 505/237 |
| 6,669,774 B1 * | 12/2003 | Zhang et al. | 117/4 |
| 6,743,531 B2 * | 6/2004 | Onabe et al. | 428/699 |
| 2002/0009868 A1 | 1/2002 | Tobashi et al. | |
| 2005/0173679 A1 * | 8/2005 | Mannhart et al. | 252/500 |

FOREIGN PATENT DOCUMENTS

| | | | |
|---|---|---|---|
| CN | 1395261 A | | 2/2003 |
| EP | 0323582 A | * | 4/1989 |
| EP | 0744474 A | | 11/1995 |
| EP | 1271666 A2 | * | 1/2003 |
| JP | 01063216 A | * | 3/1989 |
| JP | 01100820 A | * | 4/1989 |
| JP | 11-329116 A | | 11/1999 |
| JP | 2000-266667 | | 9/2000 |

(Continued)

OTHER PUBLICATIONS

Weiss, F. et al.; "HTS thin films by innovative MOCVD processes"; Journal of Alloys and Compounds; vol. 251, No. 1-2, pp. 264-269, Apr. 1997.

*Primary Examiner* — Aaron Austin
(74) *Attorney, Agent, or Firm* — Abel Law Group, LLP

(57) ABSTRACT

An MOCVD apparatus and process for producing multi-layer HTS-coated tapes with increased current capacity which includes multiple liquid precursor sources, each having an associated pump and vaporizer, the outlets of which feed a multiple compartment showerhead apparatus within an MOCVD reactor. The multiple compartment showerhead apparatus is located in close proximity to an associated substrate heater which together define multiple deposition sectors in a deposition zone.

16 Claims, 5 Drawing Sheets

FOREIGN PATENT DOCUMENTS

| | | | |
|---|---|---|---|
| JP | 2001073151 A | | 3/2001 |
| JP | 2001-266667 A | | 9/2001 |
| JP | 2003007146 A | | 1/2003 |
| JP | 2003034527 A | * | 2/2003 |
| JP | 2003036744 A | | 2/2003 |
| JP | 2003323822 A | * | 11/2003 |
| JP | 2007220467 A | * | 8/2007 |
| KR | 2001-78241 | | 8/2001 |
| KR | 2001-111027 | | 12/2001 |
| WO | WO 00/22652 | | 4/2000 |
| WO | 01/99123 A1 | | 12/2001 |

* cited by examiner

METALORGANIC CHEMICAL VAPOR DEPOSITION (MOCVD) PROCESS AND APPARATUS TO PRODUCE MULTI-LAYER HIGH-TEMPERATURE SUPERCONDUCTING (HTS) COATED TAPE

AREA OF THE INVENTION

The present invention relates to high-throughput metalorganic chemical vapor deposition (MOCVD) of high-temperature superconducting (HTS) coated wire having increased current capability.

BACKGROUND OF THE INVENTION

In the past three decades, electricity has risen from 25% to 40% of end-use energy consumption in the United States. With this rising demand for power comes an increasingly critical requirement for highly reliable, high quality power. As power demands continue to grow, older urban electric power systems in particular are being pushed to the limit of performance, requiring new solutions.

Wire forms the basic building block of the world's electric power system, including transformers, transmission and distribution systems, and motors. The discovery of revolutionary HTS compounds in 1986 led to the development of a radically new type of wire for the power industry; this discovery is the most fundamental advance in wire technology in more than a century.

HTS wire offers best-in-class performance, carrying over one hundred times more current than do conventional copper and aluminum conductors of the same physical dimension. The superior power density of HTS wire will enable a new generation of power industry technologies. It offers major size, weight, and efficiency benefits. HTS technologies will drive down costs and increase the capacity and reliability of electric power systems in a variety of ways.

For example, HTS wire is capable of transmitting two to five times more power through existing rights of way. This new cable will offer a powerful tool to improve the performance of power grids while reducing their environmental footprint.

However, to date only short samples of the HTS tape used in the manufacture of next-generation HTS wires have been fabricated at high performance levels. In order for HTS technology to become commercially viable for use in the power generation and distribution industry, it will be necessary to develop techniques for continuous, high-throughput production of HTS tape.

MOCVD is a deposition process that shows promise for the high throughput necessary to cost-effectively produce HTS tapes. During MOCVD, HTS film, such as yttrium-barium-copper-oxide ($YBa_2Cu_3O_7$ or "YBCO"), may be deposited by vapor-phase precursors onto a heated buffered metal substrate via chemical reactions that occur at the surface of the substrate.

One way to characterize coated conductors is by their cost per meter. Alternatively, cost and performance can be characterized as the cost per kiloamp-meter. More specifically, by increasing the current for a given cost per meter of coated conductor, the cost per kiloamp-meter is reduced. This is evidenced in the critical current (Jc) of the deposited HTS material multiplied by the cross-sectional area of the film.

For a given critical current and width of coated conductor, one way to increase the cross-sectional area is by increasing the HTS film thickness. However, under conventional process parameters it has been demonstrated that with critical current as a function of thickness, the critical current drops off as the thickness of a single layer of HTS film increases beyond approximately 1.5 microns and may reach saturation. This is because beyond a film thickness of approximately 1.5 microns, the HTS material becomes very porous, develops voids, and develops increased surface roughness, all of which contribute to inhibiting the flow of current. This results in limiting the critical current in coated conductors to typically 100 A/cm width.

Since, under conventional process parameters simply increasing the HTS film thickness does not result in a corresponding increase in critical current, a technical challenge exists to increase the HTS film thickness above 1.5 microns and at the same time realize a corresponding increase in current density.

In an MOCVD deposition process, factors that contribute to the morphology of the HTS film include the chamber pressure, the substrate temperature, the oxygen content and its method of introduction to the deposition zone, the amount of precursors being supplied to the deposition zone (determined by both the precursor molarity and the mass flow rate of the precursor vapors and their inert carrier gas through the showerhead assembly), the temperature at which the precursors are maintained prior to their introduction into the deposition zone, and the exhaust efficiency of the reaction byproducts away from the deposition zone.

While the optimization of some of the aforementioned parameters is well known, such as the fact that the precursor vapors and their inert carrier gas are most efficiently delivered to the deposition zone within a temperature range of 230 to 270° C., the optimization of other parameters is less well known, requiring technical innovations to be realized.

Hubert, et al., U.S. Pat. No. 5,820,678, entitled "Solid Source MOCVD System," describes a system for MOCVD fabrication of superconducting and non-superconducting oxide films that provides a delivery system for the feeding of metalorganic precursors for multi-component chemical vapor deposition. The delivery system can include multiple cartridges containing tightly packed precursor materials. The contents of each cartridge can be ground at a desired rate and fed together with precursor materials from other cartridges to a vaporization zone and then to a reaction zone within a deposition chamber for thin film deposition. A drawback of the MOCVD system of Hubert, et al., is that while it is suitable for depositing superconducting oxide films, it does not provide a process for increasing the critical current of thick HTS films.

Tatekawa, et al., U.S. Pat. No. 6,143,697, entitled "Method for Producing Superconducting Thick Film," describes a method of producing a superconducting thick film that involves the steps of forming a thick layer comprising a superconducting material on a substrate, firing the thick layer formed on the substrate, subjecting the fired thick layer to cold isostatic pressing, and re-firing the thick layer subjected to cold isostatic pressing. A drawback of Tatekawa, et al., is that while the method is suitable for forming superconducting oxide thick films, it is not a cost-effective way of manufacturing high-current HTS-coated conductors nor does it provide controlled process parameters sufficient to produce thick HTS films with increased critical current. Tatekawa, et al., is therefore not suited for the cost-effective production of high-current HTS coated conductors.

It is therefore an object of this invention to produce a high-current HTS-coated conductor with coatings formed by HTS film with a thickness in excess of 1.5 microns that have increased current capacity, over 100 A/cm width.

It is another object of this invention to provide a low-cost method of forming high-current HTS-coated conductors using an MOCVD process for producing multiple layer HTS coated tapes.

It is an object of this invention to produce YBCO films with a thickness in excess of 1.5 microns with increased current capacity for use in the manufacture of high-current HTS-coated tape.

It is an object of this invention to provide a cost-effective method of forming high-current HTS-coated conductors using an MOCVD process with precisely controlled process parameters for the deposition of YBCO thick films.

It is an object of this invention to provide a cost-effective method of forming high-current multi-layered HTS-coated conductors where the multi-layers have the same composition. It is an object of this invention to provide a cost-effective method of forming high-current multi-layered HTS-coated conductors where the multi-layers have different compositions.

SUMMARY OF THE INVENTION

The present invention is an MOCVD system for producing multi-layer HTS-coated tapes with increased current capacity. The MOCVD system of the present invention includes multiple liquid precursor sources, each having an associated pump and vaporizer, the outlets of which feed a multiple compartment showerhead apparatus within an MOCVD reactor. The multiple compartment showerhead apparatus is located in close proximity to a translating metal substrate tape and an associated substrate heater.

The multiple compartment showerhead apparatus is fed by the multiple vaporized precursor sources, where such sources include one or more HTS materials, such as a combination of compounds of yttrium (Y), barium (Ba), and copper (Cu), along with an appropriate mixture of solvents, or likewise a combination of compounds of samarium (Sm), or other rare earth, Ba, and Cu, with an appropriate mixture of solvents. In this way, multiple layers of HTS material are formed sequentially upon the translating substrate tape, where each layer is associated with a compartment of the multiple compartment showerhead apparatus. As a result, a multi-layer film deposition process is achieved in which each layer does not exceed a typical thickness of 1.5 microns, and the resulting structure collectively provides an HTS coated conductor with increased current capability as compared with a conductor having a single thick layer of HTS film.

DETAILED DESCRIPTION OF THE INVENTION

The present invention is an MOCVD system utilizing a set of controlled process parameters for producing rare earth oxide films, such as YBCO films, with increased current capacity and with a thickness in excess of 1.5 microns. Such parameters include but are not limited to the partial oxygen pressure, the precursor composition, the precursor delivery rate, and the deposition temperature.

Figure 1:
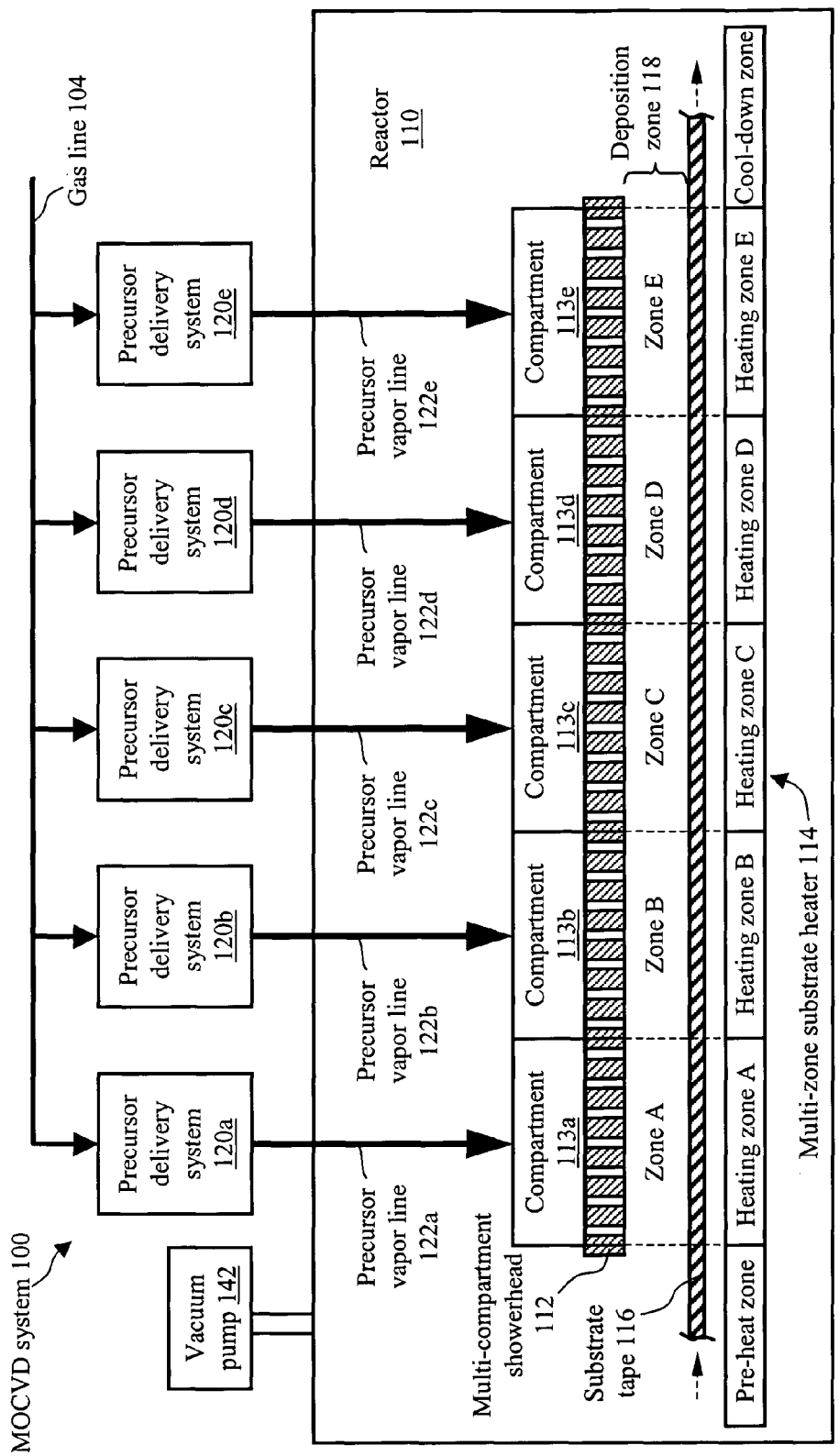
FIG. 1 illustrates an MOCVD system in accordance with a first embodiment of the present invention for producing multiple layer HTS-coated tapes with increased current capability.

The MOCVD system includes an extended length deposition zone that is further divided into sub-deposition zones arranged sequentially along its full length, wherein a translating substrate may experience the vapor deposition process. The conditions within each sub-deposition zone are dynamically and independently controlled as the substrate tape translates linearly along the deposition zone and the HTS film grows thicker and thicker, thereby providing a method of optimizing the morphology of the film and thus minimizing defects such as high porosity, voids, and surface roughness. The HTS film growth achieved via the MOCVD system of the present invention provides high-quality HTS films with a thickness in excess of 1.5 microns that have increased material density and smoothness that results in increased current capacity of over at least 100 A/cm width. FIG. 1 illustrates an MOCVD system 100 in accordance with a first embodiment of the invention. The MOCVD system 100 of the present invention is characterized by precisely controlled process parameters that allow for the production of YBCO films with a thickness in excess of 1.5 microns with increased current capacity.

The MOCVD system 100 further includes multiple instantiations of a precursor delivery system 120, for example, a precursor delivery system 120a, a precursor delivery system 120b, a precursor delivery system 120c, a precursor delivery system 120d, and a precursor delivery system 120e. The precursor vapors exit each instantiation of the precursor delivery system 120 via an associated precursor vapor line 122 feeding the multi-compartment showerhead 112 within the reactor 110. More specifically, the precursor delivery system 120a feeds the compartment 113a of the multi-compartment showerhead 112 via a precursor vapor line 122a, the precursor delivery system 120b feeds the compartment 113b of the multi-compartment showerhead 112 via a precursor vapor line 122b, the precursor delivery system 120c feeds the compartment 113c of the multi-compartment showerhead 112 via a precursor vapor line 122c, the precursor delivery system 120d feeds the compartment 113d of the multi-compartment showerhead 112 via a precursor vapor line 122d, and the precursor delivery system 120e feeds the compartment 113e of the multi-compartment showerhead 112 via a precursor vapor line 122e. Furthermore, each instantiation of the precursor delivery system 120 is fed by a common gas line 104. It is preferable to separate the common gas line into 5 individual gas lines attached to evaporators 120a, 120b, 120c, 120d, and 120d in order to control the gas flow rate precisely to each precursor delivery system. The precursor delivery system 120 is further detailed in reference to FIG. 3.

Lastly, the MOCVD system 100 includes a vacuum pump 142 functionally connected to the reactor 110. The vacuum pump 142 is a commercially available vacuum pump capable of maintaining a vacuum of pressure in the order of magnitude of $10^{-3}$ Torr, such as a Leybold model D408. Alternatively, the vacuum pressure is maintained by a combination of a mechanical pump and a mechanical booster, such as Edwards model EH500, in order to obtain a proper vacuum pressure with a large amount of liquid precursor.

Distinct areas within the deposition zone 118 are formed and associated with each compartment 113 within the multi-compartment showerhead 112. In the example shown in FIG. 1, vapors distributed from the compartment 113a are deposited upon the substrate tape 116 within a zone A, vapors distributed from the compartment 113b are deposited upon the substrate tape 116 within a zone B, vapors distributed from the compartment 113c are deposited upon the substrate tape 116 within a zone C, vapors distributed from the compartment 113d are deposited upon the substrate tape 116 within a zone D, and vapors distributed from the compartment 113e are deposited upon the substrate tape 116 within a zone B of the deposition zone 118.

The multi-zone substrate heater 114 is a well-known multiple zone substrate heater that provides heating, typically in the range of 700 to 950° C., to the substrate tape 116 via a radiant heating element, such as an infrared lamp. Alternatively, the multi-zone substrate heater 114 is a resistance heater having a heating element, such as Kanthal or $MoSi_2$ heater. The multi-zone substrate heater 114 includes multiple independently controlled heating zones (i.e., via multiple independently controlled heating elements that are not shown) that associate with zones A, B, C, D, and E of the deposition zone 118. More specifically, a heating zone A aligns with the substrate tape 116 within zone A of the deposition zone 118, a heating zone B aligns with the substrate tape 116 within zone B of the deposition zone 118, a heating zone C aligns with the substrate tape 116 within zone C of the deposition zone 118, a heating zone D aligns with the substrate tape 116 within zone D of the deposition zone 118, and a heating zone E aligns with the substrate tape 116 within zone E of the deposition zone 118.

Furthermore, assuming a direction of travel of the substrate tape 116 from zone A to zone E, the multi-zone substrate heater 114 may include a pre-heat zone that aligns with the substrate tape 116 just prior to zone A of the deposition zone 118. Lastly, the multi-zone substrate heater 114 may include a cool-down zone that aligns with the substrate tape 116 just following zone E of the deposition zone 118. The pre-heat zone ramps up the temperature of the substrate tape 116 in preparation for the substrate tape 116 entering the deposition zone 118. Conversely, the cool-down zone ramps down the temperature of the substrate tape 116 after exiting the deposition zone 118 in preparation for the substrate tape 116 exiting the reactor 110.

Figure 3:
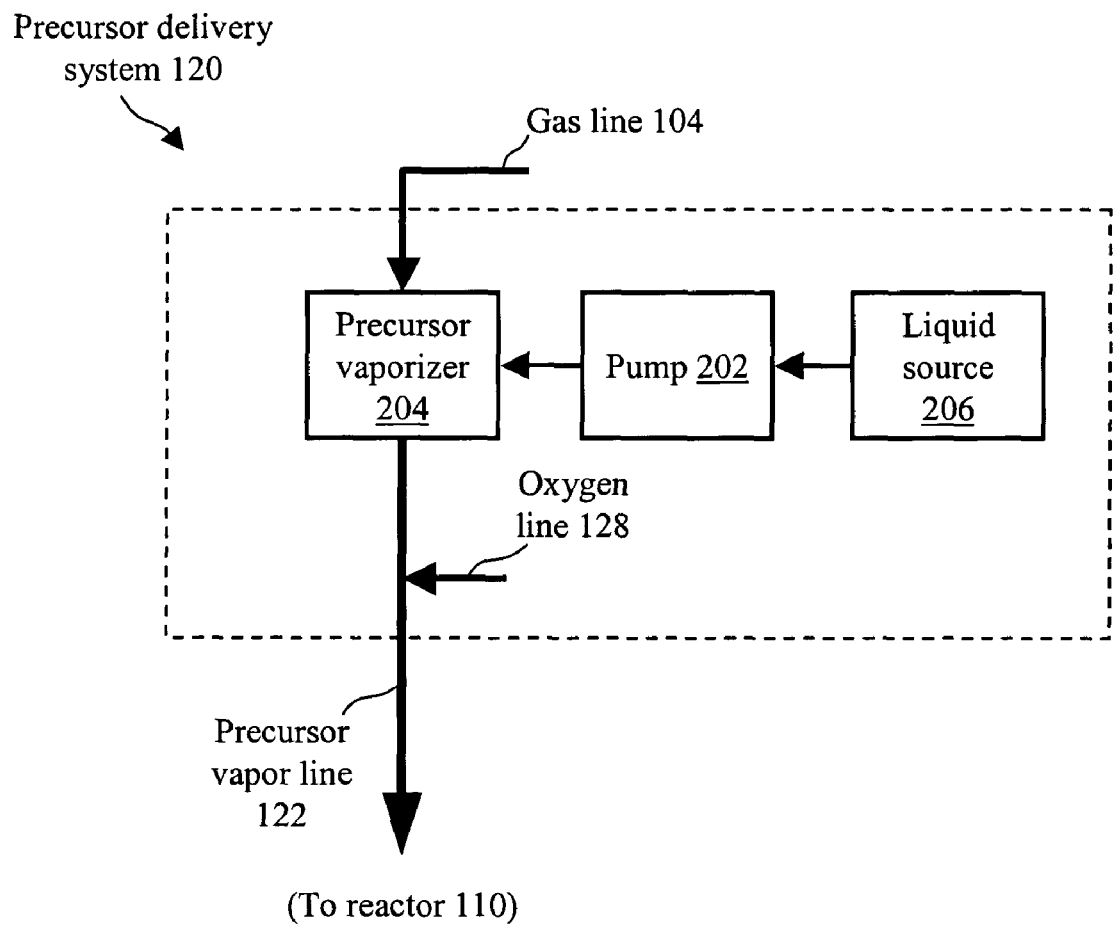
FIG. 3 illustrates the components of the precursor delivery system of the present invention.

FIG. 3 shows the elements that are included in each instantiation of the precursor delivery system 120. More specifically, each instantiation of the precursor delivery system 120 includes a liquid source 206 that is a reservoir formed of, for example, stainless steel, that contains a solution containing organometallic precursors, such as for example tetramethyl heptanedionate (THD) compounds of yttrium (Y), barium (Ba), and copper (Cu), along with an appropriate mixture of solvents, such as tetrahydrofuran and isopropanol. The liquid source 206 feeds a pump 202 that is a liquid precursor delivery pump capable of a low flow rate between 0.1 and 10 mL/min. The pump 202 is a high-pressure, low flow rate pump, such as a high-pressure liquid chromatography (HPLC) pump. The pump 202 feeds a precursor vaporizer 204, which is a device in which a precursor solution is flash vaporized at, for example, approximately 240° C. and mixed with an inert carrier gas, such as argon or nitrogen, for delivery to the multi-compartment showerhead 112. The inert carrier gas is fed into the precursor vaporizer 204 via the gas line 104 formed of tubing or piping. The precursor vapors exit the precursor vaporizer 204 via the precursor vapor line 122, which is a connecting tube or pipe through which the precursor vapors and their inert carrier gas pass on their way to the multi-compartment showerhead 112.

Just prior to the precursor vapor line 122 entering the reactor 110, an oxygen line 128 opens into the precursor vapor line 122. The oxygen line 128 is a tube or pipe through which oxygen passes for introduction to the precursor vapors and their inert carrier gas flowing within the precursor vapor line 122.

The pump 202 and the precursor vapor line 122 are sized appropriately to handle the precursor delivery to a compartment 113 of the multi-compartment showerhead 112, and subsequently to the deposition zone 118, at the proper delivery rate. The pressure and flow rate of the precursor is controlled via the combination of the specifications of the pump 202 and the diameter of the precursor vapor line 122. Similarly, the oxygen line 128 is sized appropriately to handle the oxygen delivery to the precursor vapor line 122 at the proper delivery rate and pressure. Oxygen gas line is pre-heated to approximately 240° C. in order to prevent local cold spots by introducing cold oxygen gas into the precursor delivery line.

For the purpose of discussing the MOCVD system 100 of the present invention, it can be said that the precursor delivery system 120a includes a liquid source 206a, a pump 202a, a precursor vaporizer 204a, and an oxygen line 128a feeding the precursor vapor line 122a; the precursor delivery system 120b includes a liquid source 206b, a pump 202b, a precursor vaporizer 204b, and an oxygen line 128b feeding the precursor vapor line 122b; the precursor delivery system 120c includes a liquid source 206c, a pump 202c, a precursor vaporizer 204c, and an oxygen line 128c feeding the precursor vapor line 122c; the precursor delivery system 120d includes a liquid source 206d, a pump 202d, a precursor vaporizer 204d, and an oxygen line 128d feeding the precursor vapor line 122d; and the precursor delivery system 120e includes a liquid source 206e, a pump 202e, a precursor vaporizer 204e, and an oxygen line 128e feeding the precursor vapor line 122e. Furthermore, the precursor vaporizers 204a, 204b, 204c, 204d, and 204e are all fed by the common gas line 104. It is preferable to separate the common gas line 104 into 5 individual gas line attached to evaporators 120a, 120b, 120c, 120d, and 120d in order to control the gas flow rate precisely to each precursor delivery system.

With continuing reference to FIGS. 1 and 3, the precursor delivery system 120a, the precursor delivery system 120b, the precursor delivery system 120c, the precursor delivery system 120d, the precursor delivery system 120e, the gas line 104, and the vacuum pump 142 are all located external to the reactor 110. Additionally, those skilled in the art will appreciate that the MOCVD system 100 further includes various sensing and control devices, such as pressure gauges and thermocouples, which are for simplicity not shown in FIGS. 1 and 3.

Figure 2:
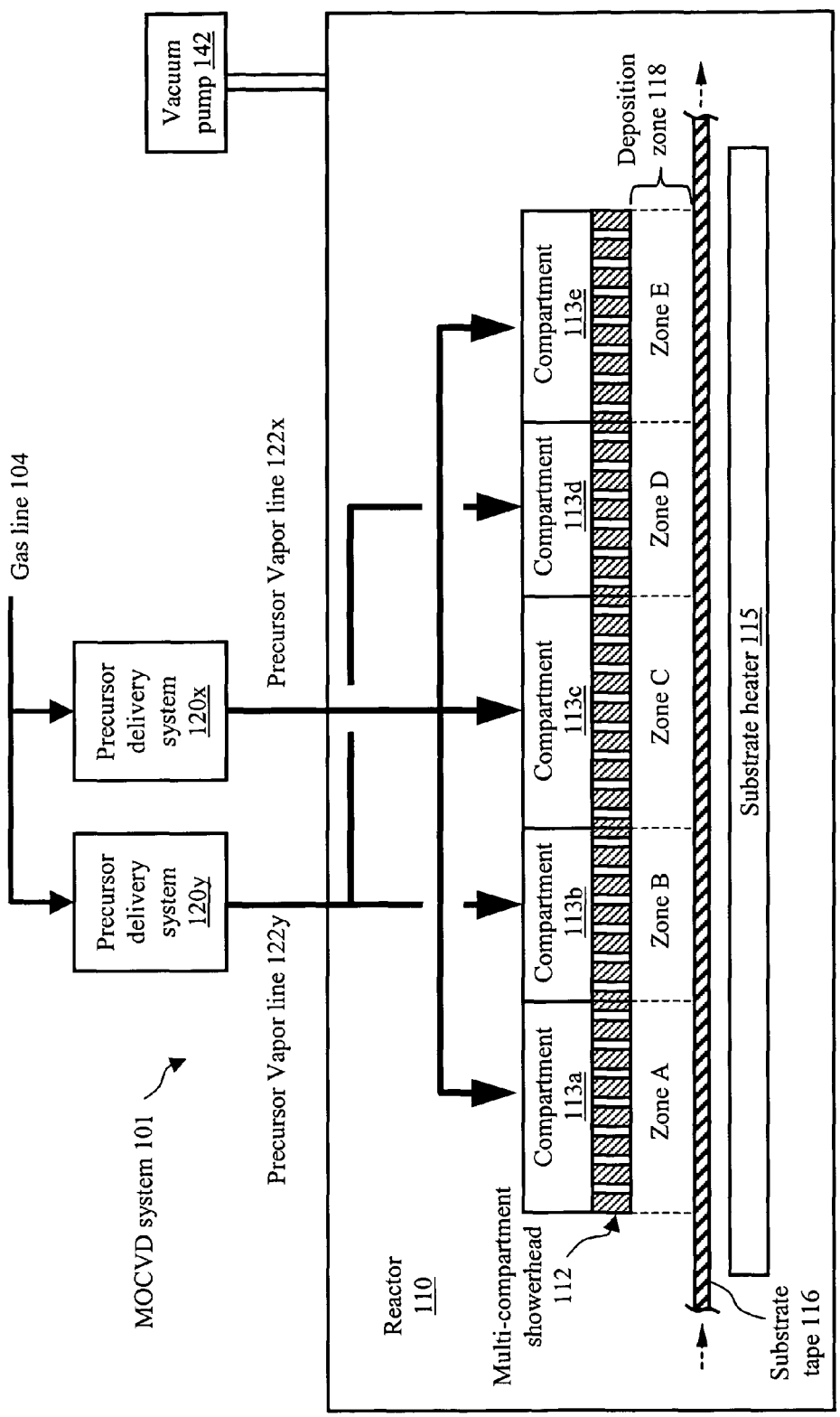
FIG. 2 illustrates an MOCVD system in accordance with a second embodiment of the present invention for producing multiple layer HTS-coated tapes with increased current capability.

It should be noted that the deposition zone 118 of the MOCVD system 100 of the present invention is not limited to zones A through E as shown in FIGS. 1 and 2. The deposition zone 118 may be expanded to include any number of zones by expanding the multi-compartment showerhead 112 to include any number of compartments 113 and by expanding the single or multi-zone substrate heater 114 to include a corresponding number of independently controlled heating zones. Furthermore, the MOCVD system 100 may be expanded accordingly to include one instantiation of the precursor delivery system 120 for each compartment 113 within the multi-compartment showerhead 112. However, for the purpose of illustration, the example of five zones, A through E, within the deposition zone 118 of the MOCVD system 100 and their associated hardware and control parameters is disclosed. Alternatively, a single precursor delivery system may feed more than one compartment of the showerhead.

Those skilled in the art will appreciate that the morphology of the deposited HTS film may change as a function of several variables, such as but not limited to:

Deposition temperature: HTS film surface roughness is affected by the deposition temperature;

Precursor composition: for example, the molarity (concentration) of the precursor affects the morphology of the film, e.g., a barium-deficient film has a morphology that differs from a barium-rich film as well as a stoichiometric film;

Precursor delivery rate: for example, the first layer deposited is continuously exposed to a high temperature as it translates through the deposition zone 118, which may cause damage to the morphology of this first layer in the time it takes to translate through the entire deposition zone 118. Increasing the precursor delivery rate for subsequent layers will shorten the time that the first layer experiences this high heat, and may thereby minimize potential damage.

Oxygen partial pressure: It is necessary to prepare the film under a different oxygen partial pressure and substrate temperature. For example, where the precursor delivery rate is increased twice from 0.25 to 0.5 ml/min good performance is obtained when 0.5 Torr higher oxygen partial pressure is used. Oxygen partial pressure should be increased in accordance with the above example when the substrate temperature is increased. Oxygen partial pressure can be determined empirically depending on processing parameter changes, such as the distance between the multi-compartment showerhead 112 and the substrate tape 116, the exposure of UV light to source vapor, or the use of atomic oxygen or ozone as an oxidant.

Specific analysis of some of the variables affecting the morphology of the HTS film is provided below.

It has been demonstrated that, assuming a delivery rate of 0.25 mL/min and a deposition temperature of 800° C., an increase in the precursor molarity (i.e., the number of moles of solute per liter of solution) of the precursor results in an increase in film thickness. For example:

a molarity of 0.030 mol/L yields a film thickness of approximately 1.0 micron;

a molarity of 0.045 mol/L yields a film thickness of approximately 1.25 microns; and a molarity of 0.060 mol/L yields a film thickness of approximately 1.75 microns. It has been demonstrated that, assuming a precursor molarity of 0.030 mol/L and a deposition temperature of 800° C., an increase in the precursor delivery rate also results in an increase in film thickness. For example:

a delivery rate of 0.25 mL/min yields a film thickness of approximately 1.0 micron;

a delivery rate of 0.50 mL/min yields a film thickness of approximately 2.0 microns; and a delivery rate of 1.00 mL/min yields a film thickness of approximately 4.0 microns.

It has been demonstrated that, assuming a deposition temperature of 800° C., varying the combination of the precursor delivery rate, the precursor molarity, and the oxygen partial pressure affects the critical current (Jc) value of the resulting film. For example:

EXAMPLE 1 delivery rate of 0.25 mL/min, combined with a molarity of 0.03 mol/L, combined with a oxygen partial pressure of 0.56 Torr yields a critical current of approximately 2.7 $MA/cm^2$ for a 0.6 micron thick film (Example 1);

EXAMPLE 2 a delivery rate of 0.50 mL/min, combined with a molarity of 0.03 mol/L, combined with a oxygen partial pressure of 0.56 Torr yields a critical current of approximately 0.0 $A/cm^2$ for a 0.6 micron thick film (the same thickness of film was obtained even though the deposition time was reduced to half that of Example 1);

EXAMPLE 3 a delivery rate of 0.50 mL/min, combined with a molarity of 0.03 mol/L, combined with a oxygen partial pressure of 1.08 Torr yields a critical current of approximately 2.5 $MA/cm^2$ for a 0.6 micron thick film (the same thickness of film was obtained even though the deposition time was reduced to half that of Example 1); and

EXAMPLE 4 a delivery rate of 0.50 mL/min, combined with a molarity of 0.06 mol/L, combined with a oxygen partial pressure of 1.08 Torr yields a critical current of approximately 2.2 $MA/cm^2$ for a 0.6 micron thick film (the same thickness of film was obtained even though the deposition time was reduced to half that of Example 3).

Furthermore, it is well known that the precursor vapors and their inert carrier gas are most efficiently delivered to the deposition zone within a temperature range of 230 to 300° C.

Lastly, the temperature of the substrate tape 116 during the deposition process may affect the end properties. For example, high critical current (Jc) of 35 A was obtained for the film with a thickness of 0.35 microns that was prepared at 800° C.(Jc=1 $MA/cm^2$). However, for a film having the same thickness but prepared at 810° C. the Jc dropped to 10A.

Using the example of FIG. 1, the specific parameters, including those outlined above, affecting the film deposition process within zones A, B, C, D, and E of the deposition zone 118 of the MOCVD system 100 are defined in Tables 1 through 5 below.

TABLE 1

Control parameters regarding zone A of the deposition zone 118

|  | Acceptable examples or acceptable range | Preferred example or preferred range |
|---|---|---|
| Liquid organometallic precursor solution within the liquid source 206a | THD compounds of Y, Ba, and Cu with a molar ratio of Y:Ba:Cu = 1:1.8-2.6:2.5-3.5, | THD compounds with a molar ratio of Y:Ba:Cu = 1:1.9-2.5:2.8-3.2, |

TABLE 1-continued

Control parameters regarding zone A of the deposition zone 118

| | Acceptable examples or acceptable range | Preferred example or preferred range |
|---|---|---|
| | with solvents, such as tetrahydrofuran and isopropanol. | with solvents. |
| Molarity of the precursor solution within the liquid source 206a | 0.015 to 0.070 mol/L | 0.050 to 0.070 mol/L |
| Temperature of the liquid precursor solution within the liquid source 206a | 200 to 300° C. | 250 to 270° C. |
| Liquid flow rate via the pump 202a | 0.1 and 10 mL/min | 0.5 to 5 mL/min |
| Flash vaporization temperature within the precursor vaporizer 204a | 200 to 300° C. | 250 to 270° C. |
| Inert gas pressure via the gas line 104 | 16 to 30 psi | 16 to 20 psi |
| Partial oxygen pressure via the oxygen line 128a | 0.4 to 5 Torr | 0.5 to 3 Torr |
| Vapor precursor temperature via the precursor vapor line 122a | 200 to 300° C. | 250 to 270° C. |
| Length of the compartment 113a of the multi-compartment showerhead 112 | 10 to 30 cm | 15 to 20 cm |
| The substrate tape 116 temperature via heating zone A of the multi-zone substrate heater 114 | 700 to 950° C. | 750 to 820° C. |
| The substrate tape 116 translation rate | 0.25 to 40 cm/min | 1 to 40 cm/min |
| Resulting HTS film thickness | 1.5 to 10 microns | 3 to 10 microns |

TABLE 2

Control parameters regarding zone B of the deposition zone 118

| | Acceptable examples or acceptable range | Preferred example or preferred range |
|---|---|---|
| Liquid organometallic precursor solution within the liquid source 206b | THD compounds of Y, Ba, and Cu with a molar ratio of Y:Ba:Cu = 1:1.8-2.6:2.5-3.5, with solvents, such as tetrahydrofuran and isopropanol. Alternately, THD compounds of Sm(or Nd, Eu), Ba, and Cu with a molar ratio of Y:Ba:Cu = 1:1.8-2.6:2.5-3.5. Alternately, part of Y is substituted into Sm (or Nd, Eu) up to 50%. | THD with a molar ratio of Y:Ba:Cu = 1:1.9-2.5:2.8-3.2, with solvents. Alternately, THD compounds of Sm(or Nd, Eu), Ba, and Cu with a molar ratio of Y:Ba:Cu = 1:1.9-2.5:2.8-3.2. Alternately, part of Y is substituted into Sm (or Nd, Eu) up to 50%. |
| Molarity of the precursor solution within the liquid source 206b | 0.015 to 0.070 mol/L | 0.050 to 0.070 mol/L |
| Temperature of the liquid precursor solution within the liquid source 206b | 200 to 300° C. | 250 to 270° C. |
| Liquid flow rate via the pump 202b | 0.1 and 10 mL/min | 0.5 to 5 mL/min |
| Flash vaporization temperature within the precursor vaporizer 204b | 200 to 300° C. | 250 to 270° C. |
| Inert gas pressure via the gas line 104 | 16 to 30 psi | 16 to 20 psi |
| Partial oxygen pressure via the oxygen line 128b | 0.4 to 5 Torr | 0.5 to 3 Torr |
| Vapor precursor temperature via the precursor vapor line 122b | 200 to 300° C. | 250 to 270° C. |
| Length of the compartment 113b of the multi-compartment showerhead 112 | 10 to 30 cm | 15 to 20 cm |
| The substrate tape 116 temperature via heating zone B of the multi-zone substrate heater 114 | 700 to 950° C. | 750 to 820° C. |
| The substrate tape 116 translation rate | 0.25 to 40 cm/min | 1 to 40 cm/min |
| Resulting HTS film thickness | 1.5 to 10 microns | 3 to 10 microns |

TABLE 3

Control parameters regarding zone C of the deposition zone 118

| | Acceptable examples or acceptable range | Preferred example or preferred range |
|---|---|---|
| Liquid organometallic precursor solution within the liquid source 206c | THD compounds of Y, Ba, and Cu with a molar ratio of Y:Ba:Cu = 1:1.8-2.6:2.5-3.5, with solvents, such as tetrahydrofuran and isopropanol. Alternately, THD compounds of Sm(or Nd, Eu), Ba, and Cu with a molar ratio of Y:Ba:Cu = 1:1.8-2.6:2.5-3.5. Alternately, part of Y is substituted into Sm (or Nd, Eu) up to 50%. | THD with a molar ratio of Y:Ba:Cu = 1:1.9-2.5:2.8-3.2, with solvents. Alternately, THD compounds of Sm (or Nd, Eu), Ba, and Cu with a molar ratio of Y:Ba:Cu = 1:1.9-2.5:2.8-3.2. Alternately, part of Y is substituted into Sm (or Nd, Eu) up to 50%. |
| Molarity of the precursor solution within the liquid source 206c | 0.015 to 0.070 mol/L | 0.050 to 0.070 mol/L |
| Temperature of the liquid precursor solution within the liquid source 206c | 200 to 300° C. | 250 to 270° C. |
| Liquid flow rate per the pump 202c | 0.1 and 10 mL/min | 0.5 to 5 mL/min |
| Flash vaporization temperature within the precursor vaporizer 204c | 200 to 300° C. | 250 to 270° C. |
| Inert gas pressure via the gas line 104 | 16 to 30 psi | 16 to 20 psi |
| Partial oxygen pressure via the oxygen line 128c | 0.4 to 5 Torr | 0.5 to 3 Torr |
| Vapor precursor temperature via the precursor vapor line 122c | 200 to 300° C. | 250 to 270° C. |
| Length of the compartment 113c of the multi-compartment showerhead 112 | 10 to 30 cm | 15 to 20 cm |
| The substrate tape 116 temperature via heating zone C of the multi-zone substrate heater 114 | 700 to 950° C. | 750 to 820° C. |
| The substrate tape 116 translation rate | 0.25 to 40 cm/min | 1 to 40 cm/min |
| Resulting HTS film thickness | 1.5 to 10 microns | 3 to 10 microns |

TABLE 4

Control parameters regarding zone D of the deposition zone 118

| | Acceptable examples or acceptable range | Preferred example or preferred range |
|---|---|---|
| Liquid organometallic precursor solution within the liquid source 206d | THD compounds of Y, Ba, and Cu with a molar ratio of Y:Ba:Cu = 1:1.8-2.6:2.5-3.5, with solvents, such as tetrahydrofuran and isopropanol. Alternately, THD compounds of Sm (or Nd, Eu), Ba, and Cu with a molar ratio of Y:Ba:Cu = 1:1.8-2.6:2.5-3.5. Alternately, part of Y is substituted into Sm (or Nd, Eu) up to 50%. | THD with a molar ratio of Y:Ba:Cu = 1:1.9-2.5:2.8-3.2, with solvents. Alternately, THD compounds of Sm (or Nd, Eu), Ba, and Cu with a molar ratio of Y:Ba:Cu = 1:1.9-2.5:2.8-3.2. Alternately, part of Y is substituted into Sm (or Nd, Eu) up to 50%. |
| Molarity of the precursor solution within the liquid source 206d | 0.015 to 0.070 mol/L | 0.050 to 0.070 mol/L |
| Temperature of the liquid precursor solution within the liquid source 206d | 200 to 300° C. | 250 to 270° C. |
| Liquid flow rate per the pump 202d | 0.1 and 10 mL/min | 0.5 to 5 mL/min |
| Flash vaporization temperature within the precursor vaporizer 204d | 200 to 300° C. | 250 to 270° C. |
| Inert gas pressure via the gas line 104 | 16 to 30 psi | 16 to 20 psi |
| Partial oxygen pressure via the oxygen line 128d | 0.4 to 5 Torr | 0.5 to 3 Torr |
| Vapor precursor temperature via the precursor vapor line 122a | 200 to 300° C. | 250 to 270° C. |
| Length of the compartment 113d of the multi-compartment showerhead 112 | 10 to 30 cm | 15 to 20 cm |
| The substrate tape 116 temperature via heating zone D of the multi-zone substrate heater 114 | 700 to 950° C. | 750 to 820° C. |

TABLE 4-continued

Control parameters regarding zone D of the deposition zone 118

|  | Acceptable examples or acceptable range | Preferred example or preferred range |
|---|---|---|
| The substrate tape 116 translation rate | 0.25 to 40 cm/min | 1 to 40 cm/min |
| Resulting HTS film thickness | 1.5 to 10 microns | 3 to 10 microns |

TABLE 5

Control parameters regarding zone E of the deposition zone 118

|  | Acceptable examples or acceptable range | Preferred example or preferred range |
|---|---|---|
| Liquid organometallic precursor solution within the liquid source 206e | THD compounds of Y, Ba, and Cu with a molar ratio of Y:Ba:Cu = 1:1.8-2.6:2.5-3.5, with solvents, such as tetrahydrofuran and isopropanol. Alternately, THD compounds of Sm (or Nd, Eu) Ba, and Cu with a molar ratio of Y:Ba:Cu = 1:1.8-2.6:2.5-3.5. Alternately, part of Y is substituted into Sm (or Nd, Eu) up to 50%. | THD with a molar ratio of Y:Ba:Cu = 1:1.9-2.5:2.8-3.2, with solvents. Alternately, THD compounds of Sm (or Nd, Eu), Ba, and Cu with a molar ratio of Y:Ba:Cu = 1:1.9-2.5:2.8-3.2. Alternately, part of Y is substituted into Sm (or Nd, Eu) up to 50%. |
| Molarity of the precursor solution within the liquid source 206e | 0.015 to 0.070 mol/L | 0.050 to 0.070 mol/L |
| Temperature of the liquid precursor solution within the liquid source 206e | 200 to 300° C. | 250 to 270° C. |
| Liquid flow rate via the pump 202e | 0.1 and 10 mL/min | 0.5 to 5 mL/min |
| Flash vaporization temperature within the precursor vaporizer 204e | 200 to 300° C. | 250 to 270° C. |
| Inert gas pressure via the gas line 104 | 16 to 30 psi | 16 to 20 psi |
| Partial oxygen pressure via the oxygen line 128e | 0.4 to 5 Torr | 0.5 to 3 Torr |
| Vapor precursor temperature via the precursor vapor line 122e | 200 to 300° C. | 250 to 270° C. |
| Length of the compartment 113e of the multi-compartment showerhead 112 | 10 to 30 cm | 15 to 20 cm |
| The substrate tape 116 temperature via heating zone E of the multi-zone substrate heater 114 | 700 to 950° C. | 750 to 820° C. |
| The substrate tape 116 translation rate | 0.25 to 40 cm/min | 1 to 40 cm/min |
| Resulting HTS film thickness | 1.5 to 10 microns | 3 to 10 microns |

Figure 4A:
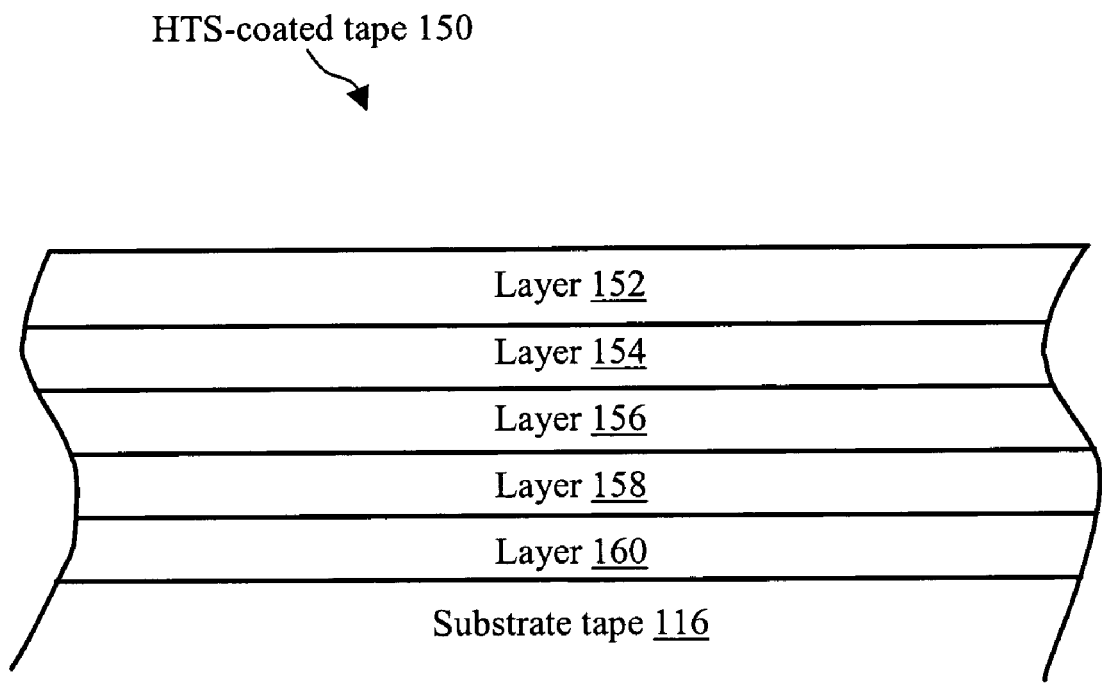
FIG. 4a illustrates a cross-sectional view of an example multi-layer coated tape formed via the first embodiment of the MOCVD system of the present invention.

The detailed operation of the MOCVD system 100 is described using an example HTS-coated tape as shown in FIG. 4a.

FIG. 4a illustrates a cross-sectional view of an example HTS-coated tape 150 formed via the MOCVD system 100 of FIG. 1. The HTS-coated tape 150 includes the substrate tape 116, upon which is first deposited a layer 160, followed by a layer 158, followed by a layer 156, followed by a layer 154, and followed lastly by a layer 152. The layer 160, the layer 158, the layer 156, the layer 154, and the layer 152 are each formed of an HTS film, such as YBCO, via the MOCVD system 100 of FIG. 1.

With reference to FIGS. 1, 3, and 4a, the operation of the MOCVD system 100 of the present invention is as follows.

Sufficient vacuum is developed within the reactor 110 by activating the vacuum pump 142. The linear translation of the substrate tape 116 through the deposition zone 118 begins in a direction progressing from zone A to zone E. (The mechanisms for translating the substrate tape 116 are not shown.) All heating elements within the multi-zone substrate heater 114 are activated to provide the desired temperature to the substrate tape 116 according to Tables 1 through 5.

The liquid sources 206a, 206b, 206c, 206d, and 206e contain a liquid organometallic precursor solution according to Tables 1 through 5. The pumps 202a, 202b, 202c, 202d, and 202e are activated to feed the liquid precursor from the liquid sources 206a, 206b, 206c, 206d, and 206e, respectively, into the precursor vaporizers 204a, 204b, 204c, 204d, and 204e, respectively. There, the solutions are flash vaporized instantly and then mixed with the inert carrier gas, such as argon or nitrogen, feeding into the precursor vaporizers 204a, 204b, 204c, 204d, and 204e from the gas line 104 to form a yttrium-barium-copper vapor precursor. The yttrium-barium-copper vapor precursors from the precursor vaporizers 204a, 204b, 204c, 204d, and 204e are then carried to the reactor 110 via the carrier gas through the precursor vapor lines 122a, 122b, 122c, 122d, and 122e, respectively. The precursor vapor lines 122a, 122b, 122c, 122d, and 122e are maintained at an appropriate temperature, according to Tables 1 through 5, via heating coils (not shown). Additionally, oxygen is introduced to the precursor vapor lines 122a, 122b, 122c, 122d, and 122e just prior to the vapor precursor entering the reactor 110 via the oxygen lines 128a, 128b, 128c, 128d, and 128e, respectively.

Having activated the deposition process within the reactor 110 of the MOCVD system 100 and set all control parameters according to Tables 1 through 5, the HTS-coated tape 150 is formed as follows.

Firstly, the precursor vapor line 122a delivers the yttrium-barium-copper containing precursor vapor to the compartment 113a of the multi-compartment showerhead 112, which uniformly directs this vapor precursor toward the substrate tape 116 within zone A of the deposition zone 118. The result of the oxygen reacting with the yttrium-barium-copper containing precursor vapor and then this reacting combination coming into contact with the hot substrate tape 116 within zone A of the deposition zone 118 causes the yttrium-barium-copper containing precursor to decompose and form the layer 160 of YBCO atop the substrate tape 116 as it translates through zone A of the deposition zone 118. The defects within the layer 160 are minimized via the control parameters according to Table 1. Thus, the layer 160 provides a high quality template for growing additional YBCO material.

Subsequently, the precursor vapor line 122b delivers the yttrium-barium-copper containing precursor vapor or an alternative precursor containing vapor such as that shown in Table 2 to the compartment 113b of the multi-compartment showerhead 112, which uniformly directs this vapor precursor toward the substrate tape 116 within zone B of the deposition zone 118. The result of the oxygen reacting with the yttrium-barium-copper containing precursor vapor or the alternative precursor vapor shown in Table 2 and then this reacting combination coming into contact with the hot substrate tape 116 within zone B of the deposition zone 118 causes the yttrium-barium-copper containing precursor vapor or the alternative precursor vapor shown in Table 2 to decompose and form the layer 158 of YBCO or HTS corresponding to alternate precursor used atop the substrate tape 116 as it translates through zone B of the deposition zone 118. The defects within the layer 158 are minimized via the control parameters according to Table 2. Thus, the layer 158 provides a high quality template for growing additional YBCO material or HTS layers corresponding to alternate precursor used.

Subsequently, the precursor vapor line 122c delivers the yttrium-barium-copper containing precursor vapor or the alternative precursor shown in Table 3 to the compartment 113c of the multi-compartment showerhead 112, which uniformly directs this vapor precursor toward the substrate tape 116 within zone C of the deposition zone 118. The result of the oxygen reacting with the yttrium-barium-copper containing precursor vapor or the alternative precursor vapor shown in Table 3 and then this reacting combination coming into contact with the hot substrate tape 116 within zone C of the deposition zone 118 causes the yttrium-barium-copper containing precursor vapor or the alternative precursor vapor shown in Table 3 to decompose and form the layer 156 of YBCO or HTS corresponding to alternate precursor used atop the substrate tape 116 as it translates through zone C of the deposition zone 118. The defects within the layer 156 are minimized via the control parameters according to Table 3. Thus, the layer 156 provides a high quality template for growing additional YBCO material or HTS layers corresponding to alternate precursor used.

Subsequently, the precursor vapor line 122d delivers the yttrium-barium-copper containing precursor vapor or the alternative precursor vapor shown in Table 4 to the compartment 113d of the multi-compartment showerhead 112, which uniformly directs this vapor precursor toward the substrate tape 116 within zone D of the deposition zone 118. The result of the oxygen reacting with the yttrium-barium-copper containing precursor vapor or the alternative precursor vapor shown in Table 4 and then this reacting combination coming into contact with the hot substrate tape 116 within zone D of the deposition zone 118 causes the yttrium-barium-copper containing precursor vapor or the alternative precursor vapor shown in Table 4 to decompose and form the layer 154 of YBCO or HTS corresponding to alternate precursor used atop the substrate tape 116 as it translates through zone D of the deposition zone 118. The defects within the layer 154 are minimized via the control parameters according to Table 4. Thus, the layer 154 provides a high quality template for growing additional YBCO material or HTS layers corresponding to alternate precursor used.

Lastly, the precursor vapor line 122e delivers the yttrium-barium-copper containing precursor vapor or the alternative precursor vapor shown in Table 5 to the compartment 113e of the multicompartment showerhead 112, which uniformly directs this vapor precursor toward the substrate tape 116 within zone E of the deposition zone 118. The result of the oxygen reacting with the yttrium-barium-copper containing precursor vapor or the alternative precursor vapor shown in Table 5 and then this reacting combination coming into contact with the hot substrate tape 116 within zone E of the deposition zone 118 causes the yttrium-barium-copper containing precursor vapor or the alternative precursor vapor shown in Table 5 to decompose and form the layer 152 of YBCO or HTS corresponding to alternate precursor used atop the substrate tape 116 as it translates through zone E of the deposition zone 118.

The defects within the layer 152 are minimized via the control parameters according to Table 5. Thus, the layer 152 provides a high quality template for growing additional HTS material or material such as silver or copper, which can be deposited by any film deposition method. As a result, collectively the YBCO layers or HTS layers corresponding to any alternate precursor used that form the HTS-coated tape 150 have a thickness of greater than 2 microns with a critical current density of approximately greater than 0.6 MA/cm$^2$.

In summary, by optimizing the deposition control parameters, a thick layer of YBCO or HTS corresponding to alternate precursor used is formed by applying one high-quality YBCO coating or HTS corresponding to alternate precursor used atop another via multiple independently controlled deposition regions (i.e., zones A, B, C, D, and B) within the deposition zone 118. In this way, the morphology of each YBCO coating or HTS corresponding to alternate precursor used that is applied one atop another is carefully controlled to minimize film defects, such as high porosity, voids, and surface roughness, thereby forming a high-quality growth template. As a result, the MOCVD system 100 of the present invention is capable of producing a YBCO film or HTS corresponding to alternate precursor used with a thickness in excess of 1.5 microns that has increased material density and smoothness that results in increased current capacity of over at least 100 A/cm width.

In an alternative embodiment, multiple precursors may be delivered to the deposition zone 118 of the MOCVD system 100 by separately installed showerheads to supply the separate precursors to the substrate tape 116 instead of using a multi-compartment showerhead designed as a single unit. Each separately installed showerhead would have an associated separate heater for supplying heat to the substrate tape 116.

FIG. 2 illustrates an MOCVD system 101 in accordance with an embodiment of the invention for producing multiple layer HTS-coated tapes with increased current capability. The MOCVD system 101 includes a conventional MOCVD reactor 110, which is a vacuum-sealed deposition chamber in which an MOCVD process occurs, such as a cold-wall reactor that may be maintained at a pressure of, for example, 1.6 Torr. The MOCVD reactor 110 houses a multi-compartment showerhead 112 located in close proximity to a substrate heater 114. A substrate tape 116 is positioned and translates (during operation) between the multi-compartment showerhead 112 and the substrate heater 115 within a deposition zone 118 along the length of the multi-compartment showerhead 112, i.e., the area in which the substrate tape 116 is exposed to the precursor vapors. The substrate tape 116 is a flexible length of substrate formed from a variety of metals, such as stainless steel or a nickel alloy such as Inconel, upon which buffer layers, such as yttria-stabilized zirconia (YSZ) and/or cerium oxide ($CeO_2$) have been previously deposited with a bi-axial texture, for instance, a (100)<001> cube texture. The substrate tape 116 is capable of withstanding temperatures over 900° C. and has dimensions that may vary to meet the desired finished product and system limitations. For example, the substrate tape 116 may have a thickness of 25 microns, a width of 1 cm, and a length of 100 meters.

The multi-compartment showerhead 112 is a device for uniformly distributing vapors onto the substrate tape 116 via fine holes within multiple compartments 113, for example, a compartment 113a, a compartment 113b, a compartment 113c, a compartment 113d, and a compartment 113e, as shown in FIGS. 1 and 2. Each compartment 113 within the multi-compartment showerhead 112 includes multiple fine holes evenly distributed throughout its area that are fed by a common inlet (not shown). Furthermore, each compartment 113 within the multi-compartment showerhead 112 is physically isolated from one another such that vapor precursors being distributed by one compartment 113 are not mixed with vapor precursors of an adjacent compartment 113. The overall length of the multi-compartment showerhead 112, the number of compartments 113 within the multi-compartment showerhead 112, the length of each compartment 113, and the specific composition of the vapor precursor feeding each compartment 113 may be user defined depending on the application.

During the deposition process, the temperature of the substrate tape 116 is properly controlled via the substrate heater 114. The substrate heater 114 is a well-known single or multiple zone substrate heater that provides heating, typically in the range of 700 to 950° C., to the substrate tape 116 via a radiant heating element, such as an infrared lamp. Alternatively, the substrate heater 114 is a resistance heater via a heating element, such as Kanthal or $MoSi_2$.

The MOCVD system 101 further includes a first and second precursor delivery system. As shown in FIG. 3 each delivery system comprises a liquid source 206 that is a reservoir formed of, for example, stainless steel, that contains a solution containing organometallic precursors, such as yttrium, barium, and copper, along with an appropriate mixture of solvents. The liquid source 206 feeds a liquid precursor delivery pump 202 capable of a low flow rate between 0.1 and 10 mL/min. The pump 202 is a high-pressure, low flow rate pump, such as a high-pressure liquid chromatography (HPLC) pump. The pump 202 feeds a precursor vaporizer 204 which are elements in which a precursor solution is flash vaporized and mixed with an inert carrier gas, such as argon or nitrogen, for delivery to the multi-compartment showerhead 112. The vaporized precursors exit the vaporizer via line 122. Just prior to each vapor line 122 entering the reactor 110 an oxygen line 128 opens into the vapor line 142. The oxygen line 128 is a tube or pipe through which oxygen passes for introduction to the precursor vapors and their inert carrier gas flowing within the precursor vapor line 122. Each instantiation of the precursor vapor line, designated 122 by a lower case letter after the number, enters the reactor 110 ready for delivery through the showerhead 112 onto a substrate 116. Lastly, the MOCVD system 101 includes a vacuum pump 142 connected to the reactor 110. The vacuum pump 142 is a commercially available vacuum pump capable of maintaining a vacuum of pressure in the order of magnitude of $10^{-3}$ Torr, such as a Leybold model D408. Alternatively, the function of the vacuum pump 142 may be accomplished by a combination of a mechanical pump and a mechanical booster, such as Edwards model EH500, in order to obtain the proper vacuum suitable for use with a large amount of liquid precursor.

The precursor delivery system 120 and the vacuum pump 142 are all located external to the reactor 110. Additionally, those skilled in the art will appreciate that the MOCVD system 101 further includes various sensing and control devices, such as pressure gauges and thermocouples, which are for simplicity not shown in FIG. 2 or 3.

Distinct areas within the deposition zone 118 are formed and associated with each compartment 113 within the multi-compartment showerhead 112. In the example shown in FIG. 2, vapors distributed from the compartment 113a are deposited upon the substrate tape 116 within a zone A, vapors distributed from the compartment 113b are deposited upon the substrate tape 116 within a zone B, vapors distributed from the compartment 113c are deposited upon the substrate tape 116 within a zone C, vapors distributed from the compartment 113d are deposited upon the substrate tape 116 within a zone D, and vapors distributed from the compartment 113e are deposited upon the substrate tape 116 within a zone E. Furthermore, the example illustrated in FIG. 2 shows the vapor precursor developed from the liquid source 120x feeding the compartments 113a, 113c, and 113e via the vapor line 122x. Likewise, the vapor precursor developed from the liquid source 120y feeds the compartments 113b and 113d via the vapor line 122y.

Figure 4B:
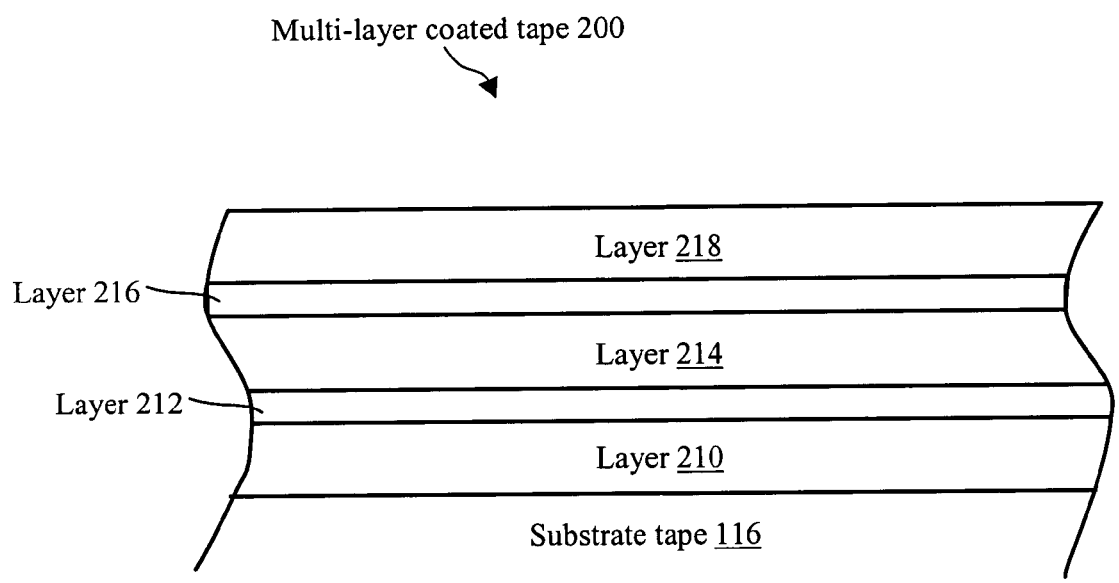
FIG. 4b illustrates a cross-sectional view of an example multi-layer coated tape formed via the second embodiment of the MOCVD system of the present invention.

The detailed operation of the MOCVD system 100 is described using an example multi-layer coated tape as shown in FIG. 4b.

FIG. 4b illustrates a cross-sectional view of an example multi-layer coated tape 200 formed via the MOCVD system 101 of FIG. 2. The multi-layer coated tape 200 includes the substrate tape 116, upon which is first deposited a layer 210, followed by a layer 212, followed by a layer 214, followed by a layer 216, and followed lastly by a layer 218. The layer 210, the layer 212, the layer 214, the layer 216, and the layer 218 are each formed of an HTS film via the MOCVD system 101 of FIG. 2. As an example, the layer 210, the layer 214, and the layer 218 are formed of YBCO with each layer having a typical thickness of up to 1.5 microns, and the layer 212 and the layer 216 are formed of samarium-barium-copper-oxide ($SmBa_2Cu_3O_7$ or "Sm123") with each layer having a typical thickness of up to 0.2 microns.

The formation of the multi-layer coated tape 200 with the layers formed of the specific HTS materials as mentioned above by the MOCVD system 101 is as follows. Sufficient vacuum is developed within the reactor 110 by activating the vacuum pump 142. The linear translation of the substrate tape 116 through the deposition zone 118 begins in a direction progressing from zone A to zone E. (The mechanical mechanisms for translating the substrate tape 116 are not shown.) The substrate heater 114 is activated and the substrate tape 116 is ramped up to a temperature typically in the range of 700 to 950° C.

The liquid source 206 contains a room temperature solution of tetramethyl heptanedionate (THD) compounds of yttrium, barium, and copper, along with an appropriate mixture of solvents such as tetrahydrofuran and isopropanol, to form a first liquid organometallic precursor.

The pump 202 is activated to feed the yttrium-barium-copper liquid precursor from the liquid source 206 into the precursor vaporizer 204 where the solution is flash vaporized instantly at approximately 240° C. and then mixes with the inert carrier gas such as argon or nitrogen, entering the precursor vaporizer 204 from the gas line 104 to form a yttrium-barium-copper vapor precursor. The yttrium-barium-copper vapor precursor is then carried to the reactor 110 using a carrier gas such as argon through the precursor vapor line 122x, which is maintained at an appropriate temperature, typically in the range of 200 to 300° C., via a heating coil (not shown). Additionally, oxygen is introduced to the vapor precursor via the oxygen line 128 just prior to the vapor precursor entering the reactor 110. The vapor line 122x delivers the yttrium-barium-copper containing precursor vapor to the compartments 113a, 113c, and 113e of the multi-compartment showerhead 112, which uniformly directs this precursor vapor toward the substrate tape 116 within zone A, zone C, and zone E of the deposition zone 118. All the while, the temperature of the substrate tape 116 is properly controlled via the substrate heater 114. The result of the oxygen reacting with the yttrium-barium-copper containing precursor vapor and precursor vapor then coming into contact with the hot substrate tape 116 causes the yttrium-barium-copper containing precursor vapor to decompose and form a film of YBCO atop the substrate tape 116 within zone A, zone C, and zone E of the deposition zone 118.

Concurrently with the pump 202 being activated to feed the yttrium-barium-copper containing liquid precursor, an identical pump is activated to feed the samarium-barium-copper containing liquid precursor from the samarium-barium-copper containing liquid source into the samarium-barium-copper containing precursor vaporizer where the solution is flash vaporized instantly at approximately 240° C. and then mixes with the inert carrier gas such as argon or nitrogen, entering the precursor vaporizer 204 from the gas line 140 to form a samarium-barium-copper containing precursor vapor. The samarium-barium-copper containing precursor vapor is then carried to the reactor 110 by using a carrier gas such as argon through the vapor line 122y, which is maintained at an appropriate temperature, typically in the range of 200 to 300° C., via a heating coil (not shown). Additionally, oxygen is introduced to the vapor precursor via the oxygen line 128 just prior to the vapor precursor entering the reactor 110. The vapor line 122y delivers the samarium-barium-copper containing precursor vapor to the compartments 113b and 113d of the multi-compartment showerhead 112, which uniformly directs this vapor precursor toward the substrate tape 116 within zone B and zone D of the deposition zone 118. All the while, the temperature of the substrate tape 116 is properly controlled via the substrate heater 114. The result of the oxygen reacting with the samarium-barium-copper containing precursor vapor and this vapor precursor then coming into contact with the hot substrate tape 116 causes the samarium-barium-copper containing precursor vapor to decompose and form a film of Sm123 atop the substrate tape 116 within zone B and zone D of the deposition zone 118.

Having activated the deposition process within the reactor 110 of the MOCVD system 101 and with continuing reference to FIGS. 2 and 4b, the multi-layer coated tape 200 is formed as follows. The translating substrate tape 116 experiences the deposition of a first layer of YBCO within zone A of the deposition zone 118 to form the layer 210. Subsequently, atop the first layer of YBCO the substrate tape 116 experiences the deposition of a first layer of Sm123 within zone B of the deposition zone 118 to form the layer 212. Subsequently, atop the first layer of Sm123 the substrate tape 116 experiences the deposition of a second layer of YBCO within zone C of the deposition zone 118 to form the layer 214. Subsequently, atop the second layer of YBCO, the substrate tape 116 experiences the deposition of a second layer of Sm123 within zone D of the deposition zone 118 to form the layer 216. Lastly, atop the second layer of Sm123 substrate tape 116 experiences the deposition of a third layer of YBCO within zone E of the deposition zone 118 to form the layer 218.

Samarium and yttrium belong to the same group within the periodic table of elements, which means that the samarium-barium-copper precursor behaves in very similar manner to the yttrium-barium-copper containing precursor. As a result, the samarium-barium-copper superconducting compound may be deposited with similar deposition conditions as the yttrium-barium-copper superconducting compound. Such processing conditions include the temperature of the vapor lines 122n of between 250 and 300° C., the substrate tape 116 temperature of between 700 to 950° C., the deposition pressure of 1 to 10 Torr, the oxygen partial pressure of 0.5 to 5 Torr, and the liquid precursor delivery rate of 0.25-10 mL/min. Since the yttrium-barium-copper precursor and the samarium-barium-copper precursor have similar properties, the heating or cooling requirements of the elements within the MOCVD system 101 need no special design to accommodate the different materials.

In general, the thickness of each layer being deposited is determined by the combination of three factors: (1) the physical length of its associated compartment, (2) its associated vapor precursor delivery rate, and (3) its associated precursor molarity (i.e., concentration of the precursor solution). Additionally, the thickness of each film is directly proportional to each of these three factors. For example, the longer the physical length of its associated compartment, the thicker the film; the higher the associated vapor precursor delivery rate, the thicker the film; and more concentrated the associated precursor solution, the thicker the film.

As one example of these controls, the thickness of the layer 212 is determined by the combination of the physical length of the compartment 113b within the multi-compartment showerhead 112, the delivery rate of the samarium-barium-copper containing precursor, and the concentration of the samarium-barium-copper containing liquid precursor.

In the case of the YBCO single layer, research indicates that the critical current reaches a maximum and levels off at around 1.5 microns because as the film thickens, the surface roughness progressively increases, making a progressively poorer and poorer template for crystal growth and causing misaligned crystals, thereby inhibiting any increase in current flow. Additionally, the film becomes more porous as the film thickens, thereby inhibiting any increase in current flow.

By contrast, the Sm123 is a smoother film than YBCO. Thus, growing Sm123 atop a layer of YBCO reduces the surface roughness and makes a better template for growing any additional YBCO layer. The YBCO-Sm123 sequence may be repeated without limiting or inhibiting the flow of current, by contrast, a single thick layer of YBCO shows no more increase of current flow beyond a thickness of about 1.5 micron. Sm123 and YBCO are both superconducting materials with similar properties, so diffusion between layers should not pose a significant problem.

The formation of a multi-layer HTS-coated tape such as the multi-layer coated tape 200 using the MOCVD system 100 is not limited to YBCO with Sm123; other superconducting materials may be used. For example, other oxides that are chemically compatible to YBCO, such as RE123 (where RE=rare earth metals such as neodymium (Nd), europium (Eu), lanthanum (La), holmium (Ho), Gadolinium (Gd)), may be used. Additionally, a multi-layer HTS-coated tape formed using the MOCVD system 100 is not limited to any specific number of layers. The multi-compartment showerhead 112 may be expanded to any number of compartments 113 as long as all precursor delivery lines and pumps are sized to handle delivery to multiple zones at the proper delivery rate. Furthermore, the substrate heater 114 may be expanded to any length accordingly. Alternatively, there may be separate heater zones within the substrate heater 114 that directly correlate to the compartments 113 and resulting deposition zones for further temperature control if needed.

In an alternative embodiment, multiple precursors may be delivered to the deposition zone 118 of the MOCVD system 100 or 101 by separately installed showerheads to supply the separate precursors to the substrate tape 116 instead of using a multi-compartment showerhead designed as a single unit. Each separately installed showerhead would have an associated separate heater for supplying heat to the substrate tape 116. While multiple layer deposition is possible using other well-known deposition processes, such as a pulsed laser deposition (PLD) process, the equipment costs associated with a PLD process are prohibitive because there is a laser associated with each layer. Thus, multiple layers require multiple lasers, which are the most expensive component of a PLD system. Therefore, the MOCVD systems 100 and 101 of the present invention are desirable, cost-effective, high-throughput way of producing multi-layer HTS-coated tapes with increased current capability.

The invention claimed is:

1. A superconductive article comprising:
   a substrate tape; and
   a superconductive layer, wherein the superconductive layer comprises a plurality of individually identifiable superconductive films of the same material, the plurality of individually identifiable superconductive films (i) comprising at least 3 superconductive films, and (ii) being disposed one atop another, atomically bonded to each other, and free of intervening bonding layers between superconductive films,
      wherein at least one of the individually identifiable superconductive films includes $YBa_2Cu_3O_7$, and another of the individually identifiable superconductive films includes $SmBa_2Cu_3O_7$.

2. The superconductive article of claim 1, wherein the substrate tape comprises a metal.

3. The superconductive article of claim 1 wherein the substrate tape contains nickel.

4. The superconducting article of claim 3 wherein the substrate tape comprises stainless steel.

5. The superconducting article of claim 3 wherein the substrate tape comprises a nickel alloy.

6. The superconducting article of claim 1 wherein the substrate tape comprises a previously deposited buffer layer.

7. The superconducting article of claim 6 wherein the buffer layer has a bi-axial texture.

8. The superconducting article of claim 6 wherein the buffer layer comprises yttrium-stabilized zirconia (YSZ).

9. The superconducting article of claim 1 wherein the superconducting layer comprises at least 4 superconductive films.

10. The superconductive article of claim 1 wherein at least two of the superconductive films in direct contact with each other have different thicknesses.

11. The superconducting article of claim 1 wherein the superconductive layer has a thickness greater than 1.5 microns.

12. The superconducting article of claim 11 wherein the superconducting layer has a thickness greater than about 2 microns.

13. The superconducting article of claim 1 wherein each of the plurality of superconductive films does not exceed a thickness of 1.5 microns.

14. The superconducting article of claim 1 wherein the superconducting article has a current capacity of at least 100A/cm width.

15. The superconducting article of claim 1 wherein the superconducting article has a current density capability of greater than $0.6$ $MA/cm^2$.

16. A superconducting article comprising:
    a metal substrate tape containing a previously deposited buffer layer; and
    a superconductive layer, wherein:
        the superconductive layer comprises at least first, second and third individually identifiable superconductive films, the first and second, and the second and third superconductive films being disposed one atop another, atomically bonded to each other, and free of intervening bonding layers between superconductive films; and
    at least one of the individually identifiable superconductive films includes $YBa_2Cu_3O_7$, and another of the individually identifiable superconductive films includes $SmBa_2Cu_3O_7$.

* * * * *